United States Patent
Khoo et al.

(10) Patent No.: US 9,252,063 B2
(45) Date of Patent: Feb. 2, 2016

(54) EXTENDED CONTACT AREA FOR LEADFRAME STRIP TESTING

(71) Applicant: Infineon Technologies AG, Neubiberg (DE)

(72) Inventors: Nee Wan Khoo, Melaka (MY); Lay Yeap Lim, Batu Berendam (MY); Tian San Tan, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/324,295

(22) Filed: Jul. 7, 2014

(65) Prior Publication Data

US 2016/0005663 A1    Jan. 7, 2016

(51) Int. Cl.
*H01L 21/44* (2006.01)
*H01L 21/46* (2006.01)
*H01L 21/66* (2006.01)
*H01L 21/78* (2006.01)

(52) U.S. Cl.
CPC .............. *H01L 22/14* (2013.01); *H01L 21/78* (2013.01); *H01L 22/32* (2013.01)

(58) Field of Classification Search
CPC ........ H01L 21/561; H01L 23/31; H01L 24/97
USPC .............. 438/14, 15, 111, 123, 113; 257/666, 257/E21.521
See application file for complete search history.

(56) References Cited

U.S. PATENT DOCUMENTS

| | | | |
|---|---|---|---|
| 6,573,121 B2 | 6/2003 | Yoneda et al. | |
| 7,087,461 B2 | 8/2006 | Park et al. | |
| 8,551,820 B1 * | 10/2013 | Foster et al. | 438/123 |
| 2005/0214980 A1 | 9/2005 | Shiu et al. | |
| 2005/0218499 A1 | 10/2005 | Chang et al. | |
| 2005/0287709 A1 | 12/2005 | Lee et al. | |
| 2012/0252142 A1 * | 10/2012 | Abbott | 438/15 |
| 2012/0274014 A1 * | 11/2012 | Byars | H01L 24/34 269/287 |
| 2012/0306065 A1 * | 12/2012 | Bin Mohd Arshad | H01L 24/97 257/676 |
| 2013/0120019 A1 * | 5/2013 | Gibbs et al. | 324/762.02 |
| 2015/0064849 A1 * | 3/2015 | Khoo et al. | 438/123 |

FOREIGN PATENT DOCUMENTS

TW           461057 B     10/2001

* cited by examiner

*Primary Examiner* — Nitin Parekh
(74) *Attorney, Agent, or Firm* — Murphy, Bilak & Homiller, PLLC

(57) ABSTRACT

A leadframe strip includes a plurality of unit leadframes connected to a periphery of the leadframe strip, each unit leadframe having a die paddle, a plurality of leads and a semiconductor die attached to the die paddle. The leadframe strip is tested by electrically isolating at least the leads from the periphery of the leadframe strip such that at least some of the leads extend uninterrupted beyond a final lead outline of the unit leadframes after electrical isolation from the periphery of the leadframe strip. The semiconductor dies are tested, which includes probing the die paddles and the leads that extend uninterrupted beyond the final lead outline of the unit leadframes after electrical isolation from the periphery of the leadframe strip. The unit leadframes are severed from the leadframe strip along the final lead outline of the unit leadframes after testing the semiconductor dies.

17 Claims, 12 Drawing Sheets

EXTENDED CONTACT AREA FOR LEADFRAME STRIP TESTING

TECHNICAL FIELD

The instant application relates to leadframe strips, and more particularly to leadframe strip testing.

BACKGROUND

A leadframe forms the base or skeleton of an IC package, providing mechanical support to semiconductor dies during assembly into a finished package. A leadframe typically includes a die paddle for attaching a semiconductor die, and leads providing the means for external electrical connection to the die. The die can be connected to the leads by wires, e.g. through wire bonding or tape automated bonds. Leadframes are typically constructed from flat sheet metal, e.g. by stamping or etching. The sheet metal is typically exposed to chemical etchants that remove areas not covered by photoresist. After the etching process, the etched frames are singulated (separated) into leadframe strips. Each leadframe strip includes a number of unit leadframes each having the die paddle and lead construction described above.

Semiconductor dies attached to the die paddles after completion of the assembly process of a leadframe strip are typically tested after separation of the unit leadframes from the leadframe strip, e.g. by punching. Alternatively, the unit leadframes remain mechanically connected to the leadframe strip by tie bars during die testing. This is commonly referred to as leadframe strip testing. Separation of the individual unit leadframes from the leadframe strip occurs after electrical testing. However, the devices must be electrically isolated from one another prior to leadframe strip testing to ensure proper device testing.

The electrical isolation process conventionally involves severing the die paddle and lead connections along a final lead outline of the unit leadframes. The final lead outline corresponds to the regions of the leadframe strip to be severed after strip testing e.g. after molding in order to separate or singulate the unit leadframes into individual packages. Severing the leads along the final lead outline of the unit leadframes limits the amount of contact area available for probing the leads, which is particularly problematic for leadless and short lead packages that have very small lead contact area inside the final lead outline for probing. Many of these packages are rated for high current operation, but conventional leadframe strip testing often cannot be performed at such high current limits due to the small contact area available for probing the leads. For example, a package rated at 40 A may only be tested at 30 A or a package rated at 100 A may only be tested at 50 A at most using conventional leadframe strip testing approaches.

SUMMARY

A leadframe strip includes a plurality of unit leadframes connected to a periphery of the leadframe strip, each unit leadframe having a die paddle, a plurality of leads and a semiconductor die attached to the die paddle. According to an embodiment of a method of testing the leadframe strip, the method comprises: electrically isolating at least the leads from the periphery of the leadframe strip such that at least some of the leads extend uninterrupted beyond a final lead outline of the unit leadframes after electrical isolation from the periphery of the leadframe strip; testing the semiconductor dies, which includes probing the die paddles and the leads that extend uninterrupted beyond the final lead outline of the unit leadframes after electrical isolation from the periphery of the leadframe strip; and severing the unit leadframes from the leadframe strip along the final lead outline of the unit leadframes after testing the semiconductor dies.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 8, which includes

DETAILED DESCRIPTION

According to embodiments described herein, a leadframe strip includes a plurality of unit leadframes. At least the leads of the unit leadframes are electrically isolated from the periphery of the leadframe strip prior to strip testing. At least some of the leads extend uninterrupted beyond a final lead outline of the unit leadframes after electrical isolation from the periphery of the leadframe strip. The leads that extend uninterrupted beyond the final lead outline of the unit leadframes after the electrical isolation process have additional contact area for test probing. In some cases, the part of the leads that extend uninterrupted beyond the final lead outline of the unit leadframes after the electrical isolation process are actually probed during the testing process. In other cases, the leads with the extended contact area remain integrally connected to the die paddle of an adjacent unit leadframe during the testing process so that the adjacent die paddle can be probed during testing instead of the leads themselves. In each case, ease of testing is improved and higher current testing is possible with the techniques described herein. The unit leadframes are later severed from the leadframe strip along the final lead outline of the unit leadframes after testing the semiconductor dies to yield individual (singulated) packages.

Figure 1:
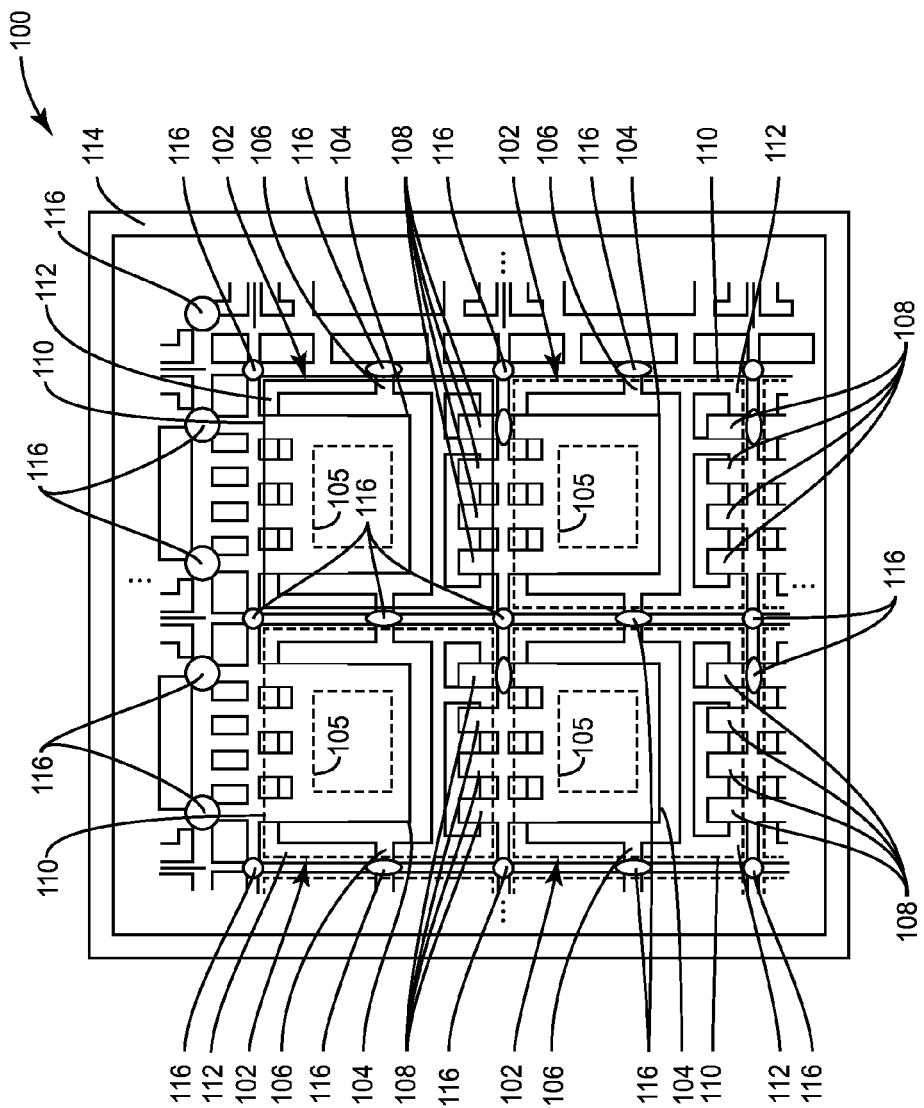
FIG. 1 illustrates a partial bottom plan view of an embodiment of a leadframe strip having leads and die paddles that are electrically isolated from the periphery of the leadframe strip prior to die testing.

FIG. 1 illustrates a bottom plan view of a leadframe strip 100 according to an embodiment. The leadframe strip 100 includes a plurality of connected unit leadframes 102, four of which are shown completely in FIG. 1. Each unit leadframe 102 has a die paddle 104 for attaching one or more semiconductor dies 105, tie bars 106 connecting the die paddles 104 to the periphery of the unit leadframe 102, and a plurality of leads 108 connected to the periphery of the unit leadframe 102. The semiconductor dies 105 are shown as dashed boxes in FIG. 1 because the dies 105 are not visible from the bottom side of the leadframe strip 100. Each unit leadframe 102 has a final lead outline 110. The final lead outline 110 defines where the unit leadframes 102 are later severed from the leadframe strip 100 after testing the semiconductor dies 105. As such, the final lead outline 110 of the unit leadframes 102 corresponds to the lead footprint of the individual packages to be realized from the leadframe strip 100. The leads 108 of each unit leadframe 102 are integrally connected to the periphery of the corresponding unit leadframe 102 outside the final lead outline 110, and extend from the periphery to within (inside) the final lead outline 110 toward the corresponding die paddle 104. The die paddles 104 and leads 108 can comprise any standard leadframe metal such as an iron nickel alloy, copper, etc. The boxes labeled 110 in FIG. 1 represent the final lead outline of the unit leadframes 102.

In one embodiment, the leadframe strip 100 is constructed from flat sheet metal, e.g. by stamping or etching. For example, the sheet metal can be exposed to chemical etchants that remove areas not covered by photoresist. Other processing can be performed, e.g. laser etching to pattern the sheet metal. After the patterning process, the patterned frames are singulated (separated) into leadframe strips. One such leadframe strip 100 is shown in FIG. 1.

Electrical connections such as wire bonds or metal clips (out of view in FIG. 1) are formed between the leads 108 of each unit leadframe 102 and terminals of the semiconductor dies 105 attached to the die paddles 104. The unit leadframes 102 and the semiconductor dies 105 are then encapsulated with a molding compound 112 at the top side of the leadframe strip 100. The molding compound 112 is partly visible in FIG. 1 through openings in the leadframe strip 100, and can be segmented to cover individual ones of the unit leadframes 102 with spacing between the molding compound 112 of each unit leadframe 102 (so-called cavity molding). Alternatively, the molding compound 112 is not segmented and instead continuously covers multiple ones of the unit leadframes 102 without interruption between the unit leadframes 102 (so-called map molding). Any standard semiconductor package molding compound and process can be used.

Prior to testing the semiconductor dies 105 attached to the die paddles 104 of the unit leadframes 102, at least the leads 108 and optionally the die paddles 104 are electrically isolated from the periphery 114 of the leadframe strip 100 such that at least some of the leads 108 continue to extend uninterrupted beyond the final lead outline 110 of the unit leadframes 102 after electrical isolation from the periphery 114 of the leadframe strip 100. The leads 108 and the die paddles 104 can be electrically isolated from the periphery 114 of the leadframe strip 100 by removing parts of the leadframe strip 100 at the bottom side of the leadframe strip 100. FIG. 1 shows different parts 116 of the leadframe strip 100 which have been removed in order to electrically isolate the leads 108 and the die paddles 104 from the periphery 114 of the leadframe strip 100. The parts 116 of the leadframe strip 100 identified in FIG. 1 can be removed by laser drilling, water jet cutting or etching at the bottom side of the leadframe strip 100 i.e. the side opposite the molding compound 112. Laser drilling, water jet cutting and etching of leadframe strips are well-known and well-defined processes in the semiconductor packaging arts, and therefore no further explanation is given herein in this regard.

The semiconductor dies 105 are tested after the leads 108 and the die paddles 104 are electrically isolated from the periphery 114 of the leadframe strip 100. The testing process includes probing the die paddles 104 and the leads 108 that extend uninterrupted beyond the final lead outline 110 of the unit leadframes 102 after electrical isolation from the periphery 114 of the leadframe strip 100. Any standard leadframe strip test equipment can be used to probe the leads 108 and die paddles 104 for testing the semiconductor dies 105.

Figure 2:
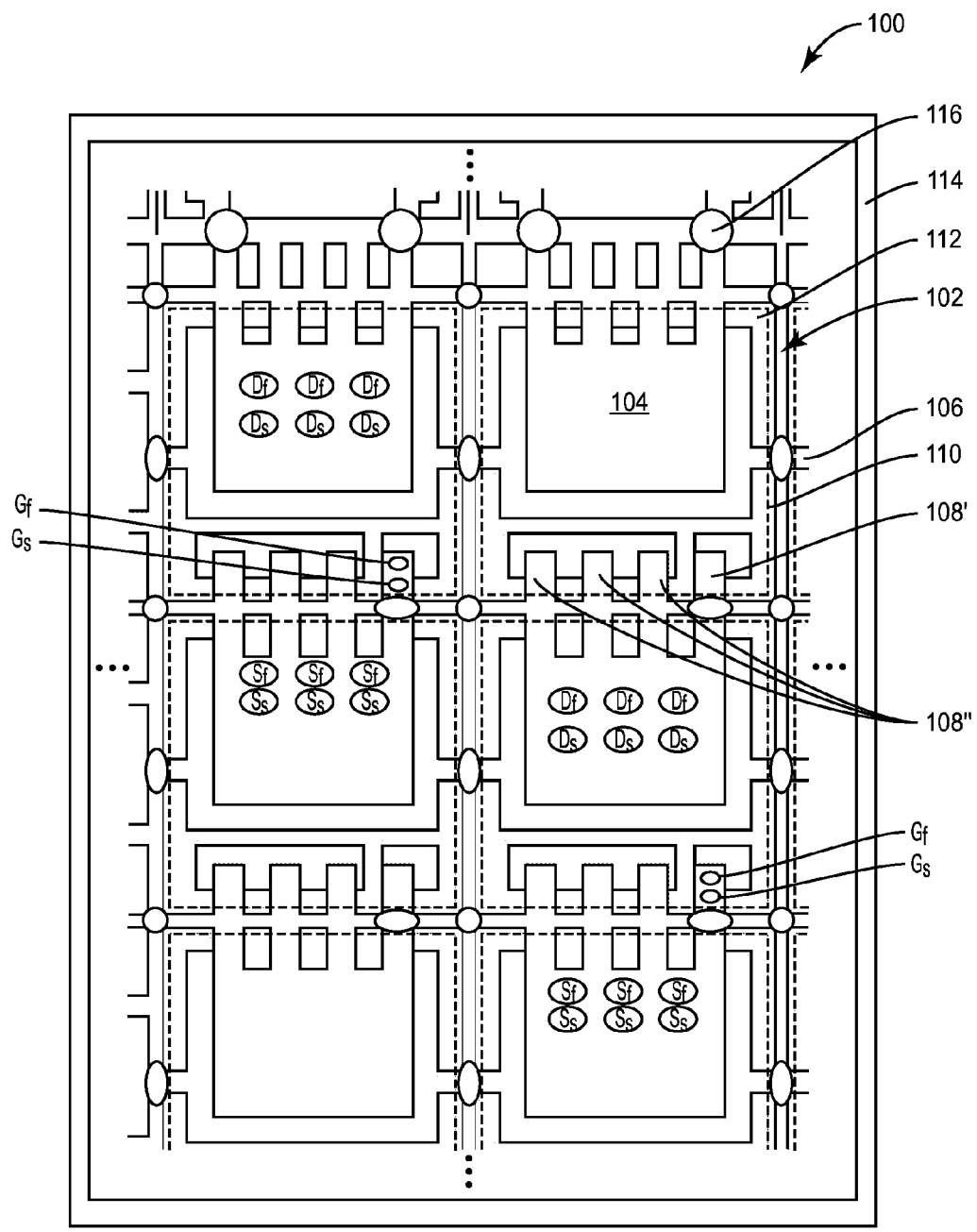
FIG. 2 illustrates a partial bottom plan view of another embodiment of a leadframe strip having leads and die paddles that are electrically isolated from the periphery of the leadframe strip prior to die testing.

FIG. 2 illustrates one embodiment of electrically isolating the leads 108 and the die paddles 104 from the periphery 114 of a leadframe strip 100 prior to die testing. According to this embodiment, at least some of the leads 108 of the unit leadframes 102 remain integrally connected to the die paddle 104 of an adjacent unit leadframe 102 after electrical isolation from the periphery 114 of the leadframe strip 100. According to one embodiment, the semiconductor dies 105 are transistor dies. Each transistor die has an output terminal such as a drain terminal for a MOSFET or JFET or a collector terminal for an IGBT attached to the die paddle 104 of the corresponding unit leadframe 102, a gate terminal electrically connected to a first subset 108' of the leads 108 for that unit leadframe 102 and a reference terminal such as a source terminal for a MOSFET or JFET or an emitter terminal for an IGBT electrically connected to a second subset 108" of the leads 108 for that unit leadframe 102. The transistor die 105 can have additional terminals e.g. such as a sense terminal (not shown) electrically connected to a third subset (not shown) of the leads 108 for the corresponding unit leadframe 102. In FIG. 2, the first subset 108' includes one gate lead. However, the first subset 108' can include more than one gate lead.

The first subset 108' of (gate) leads is severed from the die paddle 104 of the adjacent unit leadframe 102 prior to testing the transistor die 105. Each semiconductor die 105 is then tested by probing the die paddle 104 of that unit leadframe 102, probing the die paddle 104 of an adjacent unit leadframe 102 instead of the reference leads 108" of the unit leadframe 102 under test that remain integrally connected to the die paddle 104 of the adjacent unit leadframe 102 and testing each transistor die 105 via the probe connections to the die paddles 104 of both unit leadframes 102. During testing of the transistor dies 105, each lead in the first subset 108' is probed to access the gate terminal of the corresponding transistor die 105 and the die paddle 105 of an adjacent unit leadframe 102 is probed instead of the leads in the second subset 108" to access the reference terminal of that transistor die 105. In the case of a MOSFET die 105, the probe contacts for applying a test signal to the drain terminal of the dies 105 are labeled 'Df' in FIG. 1, the probe contacts for applying a test signal to the source terminal of the dies 105 are labeled 'Sf' in FIG. 1 and the probe contacts for applying a test signal to the gate terminal of the dies 105 are labeled 'Gf' in FIG. 1. The probe contacts for the corresponding sense signals are labeled 'Ds', 'Ss' and 'Gs', respectively, in FIG. 1. Each unit leadframe 102 can be tested in a similar manner.

Figure 3:
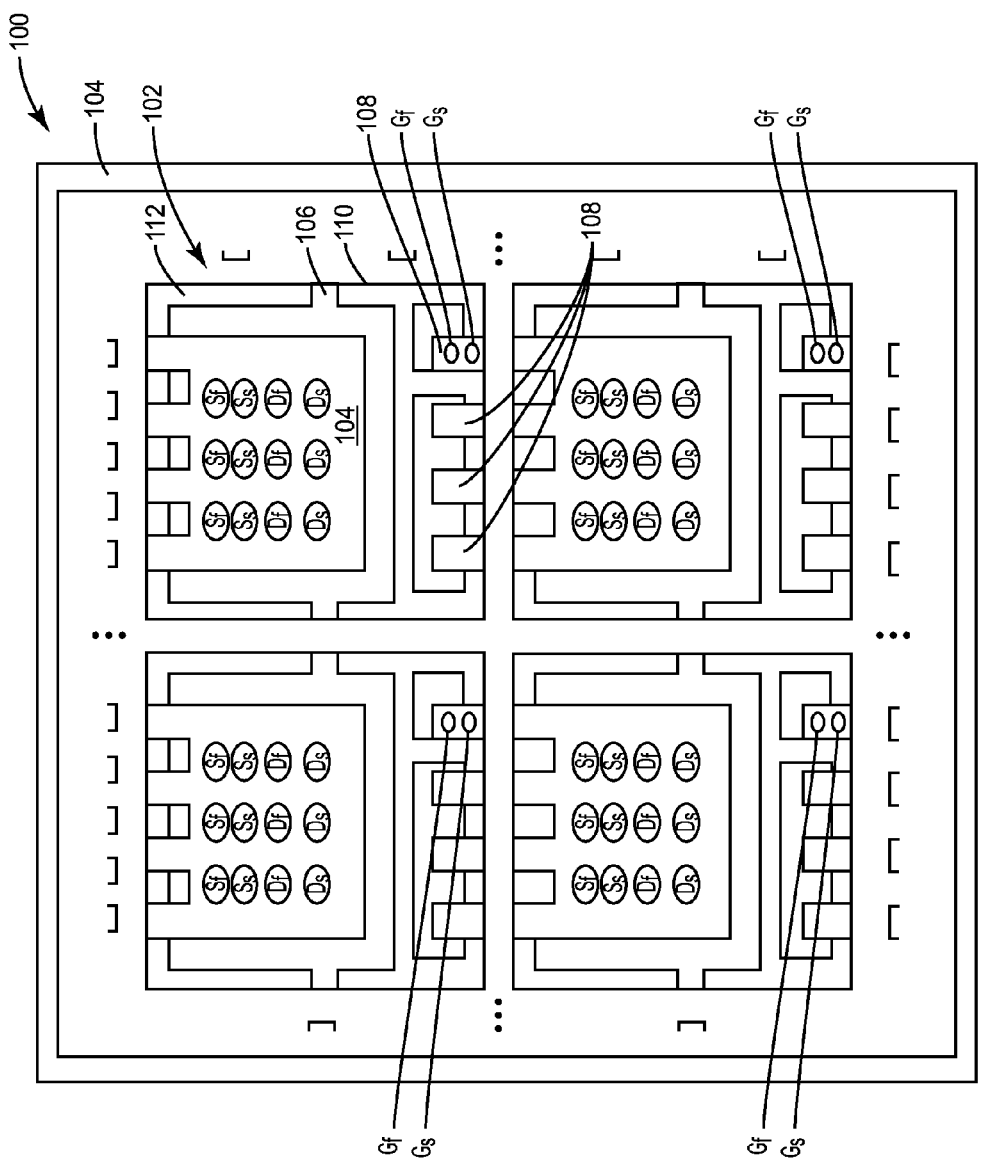
FIG. 3 illustrates a partial bottom plan view of the leadframe strip of FIG. 2 after die testing and during the package singulation process.

FIG. 3 shows the leadframe strip 100 illustrated in FIG. 2 after die testing is complete. The unit leadframes 102 are severed from the leadframe strip 100 along the final lead outline 110 of the unit leadframes 102 after testing the semiconductor dies 105. The unit leadframes 102 can be severed from the leadframe strip 100 by laser drilling, water jet cutting or etching at the bottom side of the leadframe strip 100. Also shown in FIG. 3 are the probe marks (Df, Ds, Sf, Ss, Gf, Gs) made in the leads 108 and the die paddles 104 as part of the die testing process. The probe marks represent where the test probes contacted the leads 108 and die paddles 104 during the testing process. Not all of the leads 108 are necessarily contacted during testing as previously described herein. Instead, the die paddle 104 of one unit leadframe 102 can be contacted to test the semiconductor die 105 of the adjacent unit leadframe 102. In this embodiment, the leads 108 of the unit leadframe 102 under test and which are not contacted during testing remain integrally connected to the die paddle 104 of the adjacent unit leadframe 102 after electrical isolation from the periphery 114 of the leadframe strip 100 and are later severed from this die paddle 104 as part of the package singulation process. For example in the case of a transistor die 105, this can mean that the reference leads (e.g. source leads of a MOSFET or JFET or emitter leads of an IGBT) are not contacted during testing and instead the die paddle 104 of the adjacent unit leadframe 102 is contacted to form an electrical connection between the test equipment and the transistor die 105 under test.

Figure 4:
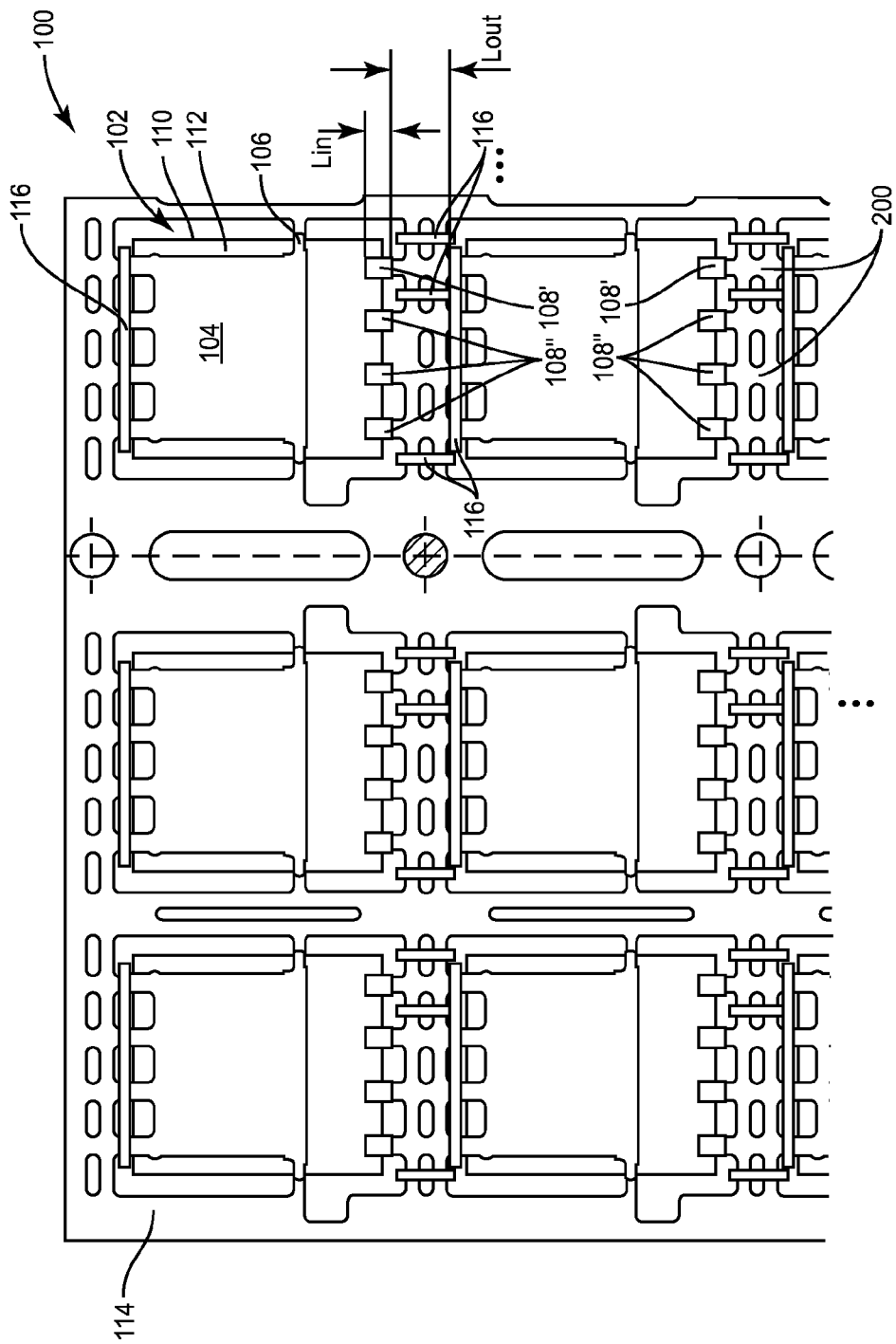
FIG. 4 illustrates a partial bottom plan view of another embodiment of a leadframe strip having leads and die paddles that are electrically isolated from the periphery of the leadframe strip prior to die testing.

FIG. 4 illustrates another embodiment of electrically isolating the leads 108 and the die paddles 104 from the periphery 114 of a leadframe strip 100 prior to die testing. According to this embodiment, the first subset 108' of leads (gate leads in this example) extends uninterrupted beyond the final lead outline 110 of the unit leadframe 102 in one row of the leadframe strip 100 after being severed from the die paddle 104 of the corresponding unit leadframe 102 in the adjacent row. This way, during testing of each transistor die 105, the lead(s) in the first subset 108' can be probed outside the final lead outline 110 of the corresponding unit leadframe 102. The length by which the first subset 108' of leads extends uninterrupted beyond the final lead outline 110 of the unit leadframe 102 after the electrical isolation process is identified as Lout and the length of those leads within (inside) the final lead outline 110 is labeled Lin in FIG. 4.

The leads in the second subset 108" can be similarly separated from the die paddle 104 of the adjacent unit leadframe 102 in a region outside the final lead outline 110 of the unit leadframes 102 as shown in FIG. 4, so that the leads in the second subset 108" also can be probed outside the final lead outline 110 of the corresponding unit leadframe 102. As a result, a larger contact area is provided for probing the leads 108 of each unit leadframe 102. The parts 116 of the leadframe strip 100 removed in order to electrically isolate the die paddles 104 and the leads 108 of the unit leadframes 102 from the periphery 114 of the leadframe strip 100 are illustrated as solid straight lines in FIG. 4. The final lead outline 110 of the unit leadframes 102 are illustrated as boxes around the die paddles 104 and leads 108 and are labeled 110 in FIG. 4. Further according to the embodiment of FIG. 4, the die paddle 104 of each unit leadframe 102 in the first row of the leadframe strip 100 is integrally connected to the periphery 114 of the leadframe strip 100. The die paddles 104 of the unit leadframes 102 in the first row of the leadframe strip 100 are severed from the periphery 114 of the leadframe strip 114 to electrically insulate those die paddles 104 from the periphery 114 of the leadframe strip 100 prior to die testing.

In some embodiments, the part 200 of the leads 108 that extend uninterrupted beyond the final lead outline 110 of the unit leadframes 102 after the electrical isolation process have a probe contact area that is at least three times greater than the contact area of the leads within the final lead outline of the unit leadframes. In some cases, the part 200 of the leads 108 that extend uninterrupted beyond the final lead outline 110 of the unit leadframes 102 after electrical isolation from the periphery 114 of the leadframe strip 100 have a probe contact area that is at least ten times greater than the contact area of the leads 108 within the final lead outline 110 of the unit leadframes 102.

Figure 5:
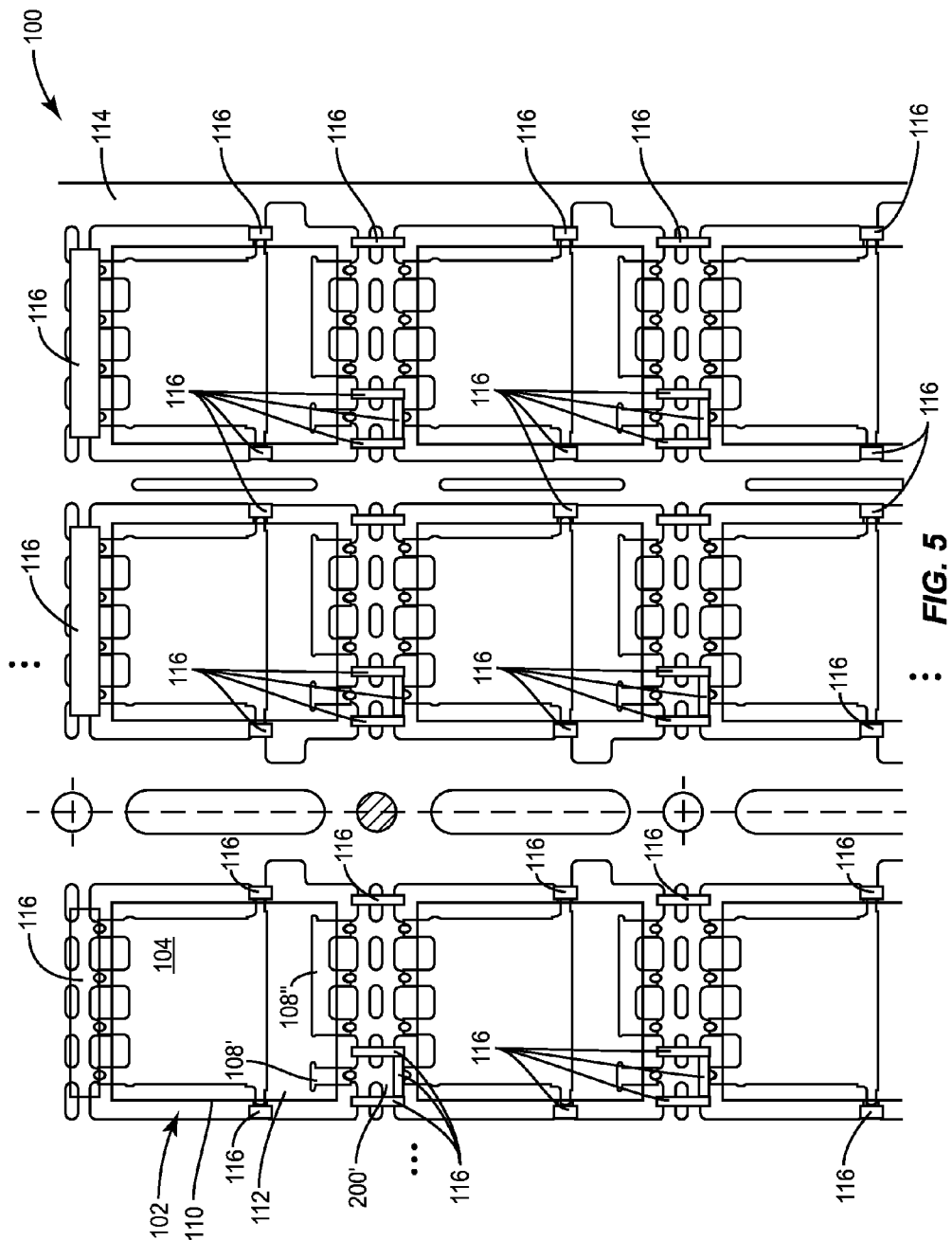
FIG. 5 illustrates a partial bottom plan view of yet another embodiment of a leadframe strip having leads and die paddles that are electrically isolated from the periphery of the leadframe strip prior to die testing.

FIG. 5 illustrates another embodiment of electrically isolating the leads 108 and the die paddles 104 from the periphery 114 of a leadframe strip 100 prior to die testing. The embodiment shown in FIG. 5 is similar to the embodiment shown in FIG. 4, however, the source leads 108" of one unit leadframe 102 remain integrally connected to the die paddle 104 of the adjacent unit leadframe 102 after the electrical isolation process e.g. as previously described herein in connection with FIGS. 1-3, so that both the gate lead(s) 108' and the source leads 108" of the unit leadframes 102 have larger contact area for test probing. The leadframe strip 100 is cut along the lines labeled 116 in FIG. 5 to implement the electrical isolation. However unlike the embodiments associated with FIGS. 1-3, the gate lead(s) 108' extend beyond (outside) the final lead outline 110 of the unit leadframe 102 after the electrical isolation process. The final lead outline 110 of the unit leadframes 102 are illustrated as boxes around the die paddles 104 and leads 108 and are labeled 110 in FIG. 4. The gate lead(s) 108 thus can be probed in the extended area 200' during die testing, and the source leads 108" can be accessed during die testing by probing the die paddle 104 of the adjacent unit leadframe 102 to which the source leads 108" remain integrally connected after the electrical isolation process. The connection between the source leads 108" of one unit leadframe 102 and the die paddle 104 of an adjacent unit leadframe 102 is severed along the final lead outline 110 after the testing process is complete, as part of the package singulation process.

Figure 6:
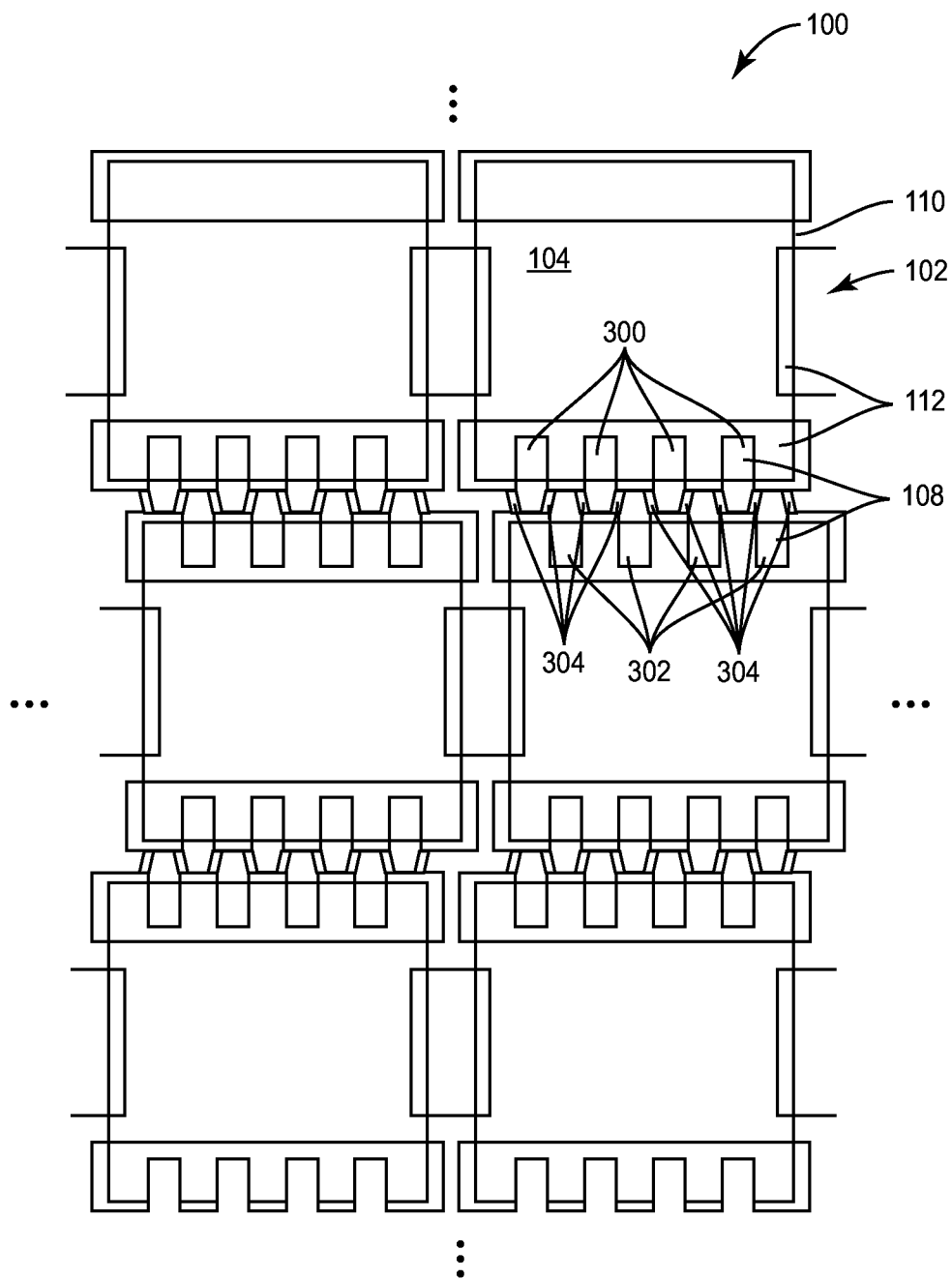
FIG. 6 illustrates a partial bottom plan view of an embodiment of a leadframe strip having die paddles and interdigitated leads that are electrically isolated from the periphery of the leadframe strip prior to die testing.

FIG. 6 illustrates another embodiment of electrically isolating the leads 108 and the die paddles 104 from the periphery 114 of a leadframe strip 100 prior to die testing. According to this embodiment, a first group 300 of the leads 108 of each unit leadframe 102 in one row of the leadframe strip 100 are integrally connected in an interdigitated arrangement to a second group 302 of the leads 108 of the unit leadframes 102 in the adjacent row of the leadframe strip 100. The connection between the interdigitated leads 108 of the different unit leadframes 102 is severed prior to die testing. The interdigitated leads 108 are severed in a region 304 of the leadframe strip 100 such that the leads 108 in the first and second groups 300, 302 extend uninterrupted beyond the final lead outline 110 of the respective unit leadframes 102 without contacting each other after the severing process.

Figure 7:
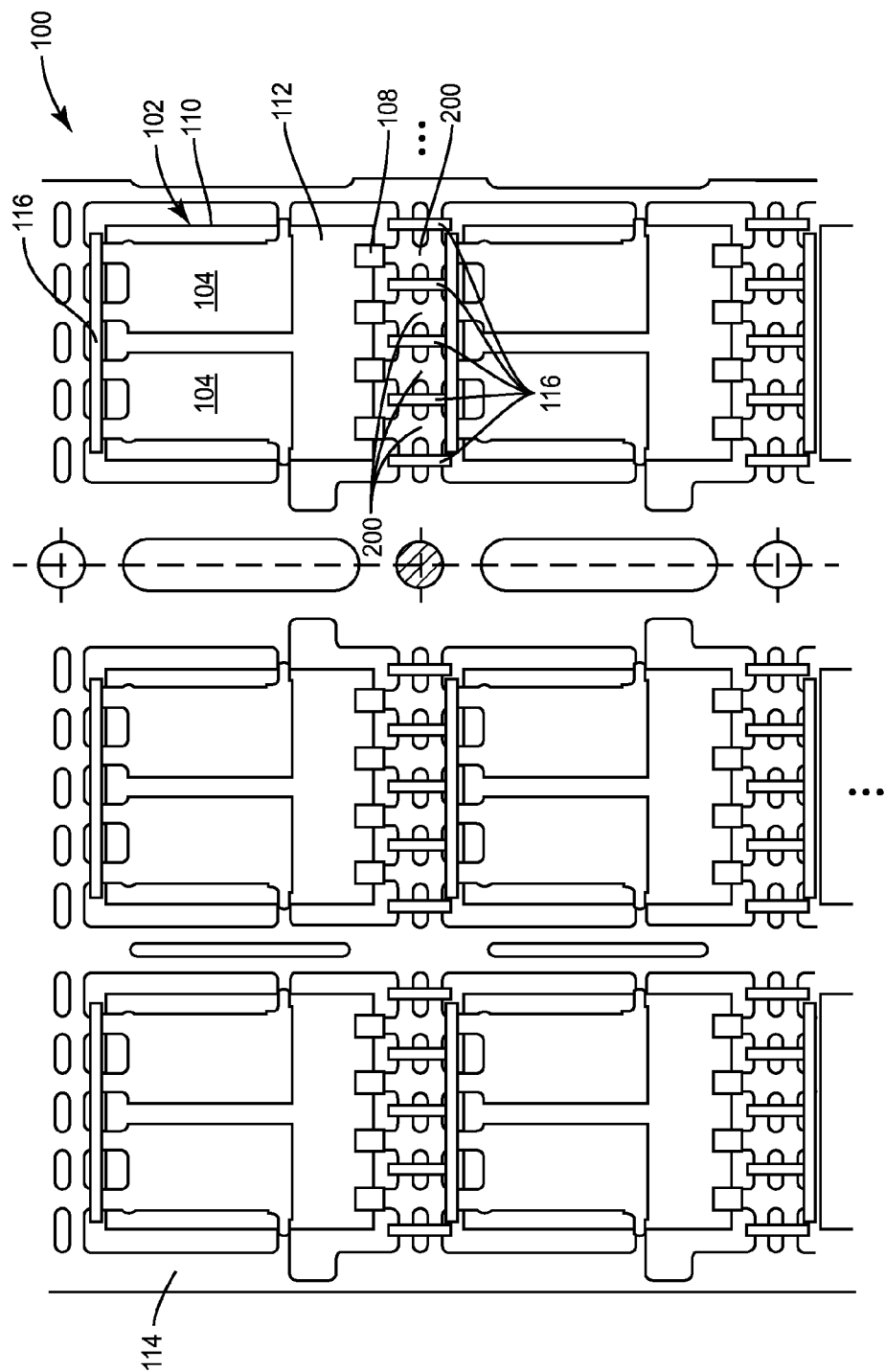
FIG. 7 illustrates a partial bottom plan view of an embodiment of a leadframe strip having multiple die paddles per unit leadframe and where the die paddles and leads are electrically isolated from the periphery of the leadframe strip prior to die testing.

FIG. 7 illustrates an embodiment of electrically isolating the leads 108 and the die paddles 104 from the periphery 114 of a leadframe strip 100 prior to die testing, for unit leadframes 102 that include more than one die paddle 104. According to this embodiment, each unit leadframe 102 has a plurality of die paddles 104 and a semiconductor die (out of view) attached to each die paddle 104. The leads 108 and the die paddles 104 of each unit leadframe 102 are electrically isolated from the periphery 114 of the leadframe strip 100 prior to die testing such that at least some of the leads 108 of each unit leadframe 102 extend uninterrupted beyond the final lead outline 110 of that unit leadframe 102 after the electrical isolation process. The final lead outline 110 of the unit leadframes 102 are illustrated as boxes around the die paddles 104 and leads 108 and are labeled 110 in FIG. 7. The leadframe strip 100 is cut along the lines labeled 116 in FIG. 7 to electrically isolate the leads 108 and the die paddles 104 from the periphery 114 of the leadframe strip 100 prior to die testing. The leads 108 are severed in a region of the leadframe strip 100 such that the leads 108 extend uninterrupted beyond the final lead outline 110 of the respective unit leadframes 102 after the severing process to provide additional contact area for probing during the die testing process.

Figure 8A:
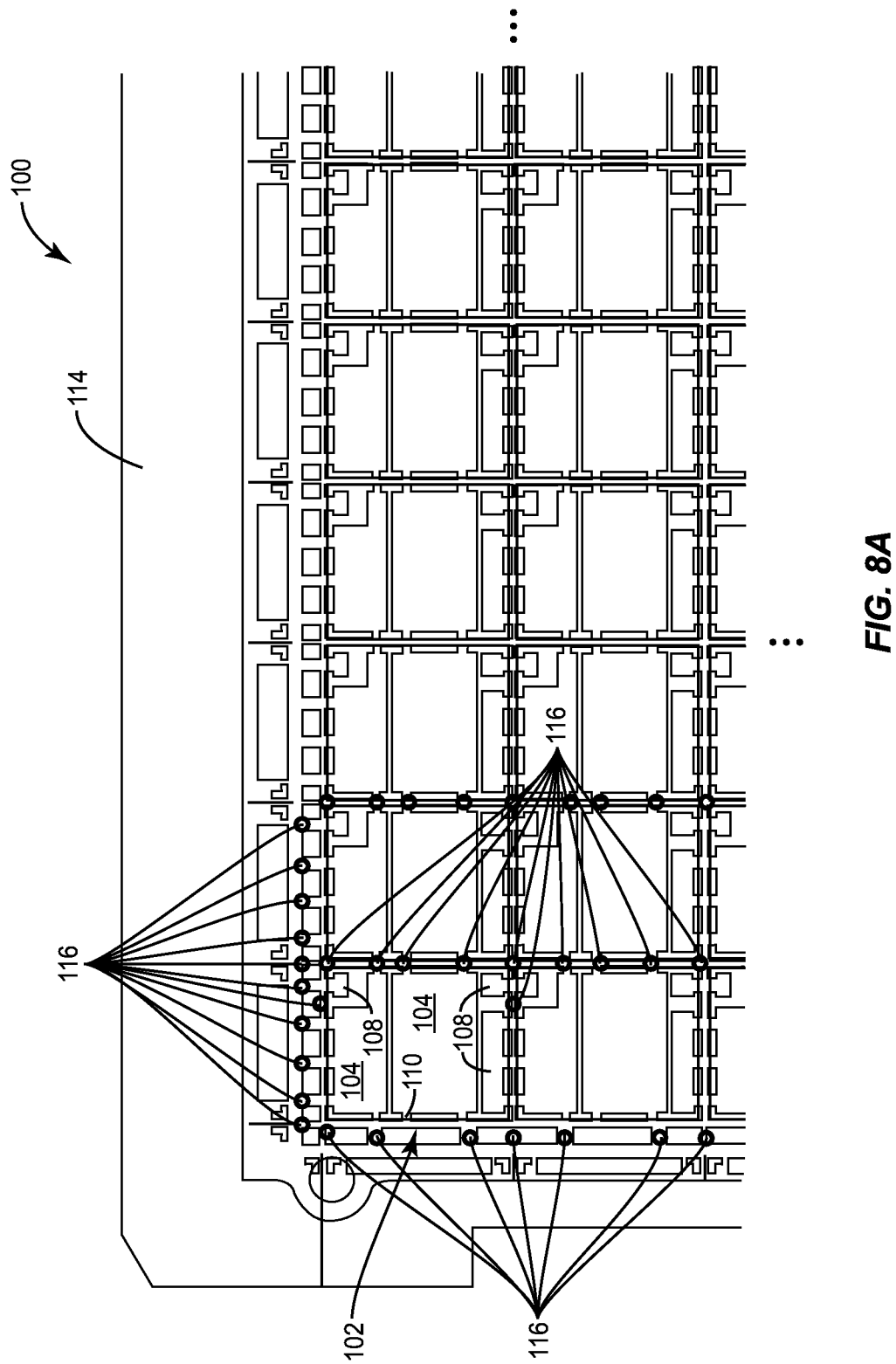
FIGS. 8A through 8D, illustrates an embodiment of the electrical isolation and die testing processes for unit leadframes of a leadframe strip that include more than one die paddle.

FIG. 8, which includes FIGS. 8A through 8D, illustrates an embodiment of the electrical isolation and die testing processes for unit leadframes 102 of a leadframe strip 100 that include more than one die paddle 104. In one example, each unit leadframe 102 includes two MOSFET dies each having a source terminal, a drain terminal and a gate terminal. The dies and electrical connections between the dies and the leads 108 are on the opposite side of the leadframe strip 100 shown in FIG. 8, and therefore are out of view. The regions of the leadframe strip 100 labeled 116 in FIG. 8A are removed e.g. by laser drilling, water jet cutting or etching to electrically isolate the leads 108 and die paddles 104 of the unit leadframes 102 from the periphery 114 of the leadframe strip 100 prior to die testing. FIG. 8A shows the electrical isolation process for two partial rows of the leadframe strip 100.

Figure 8B:
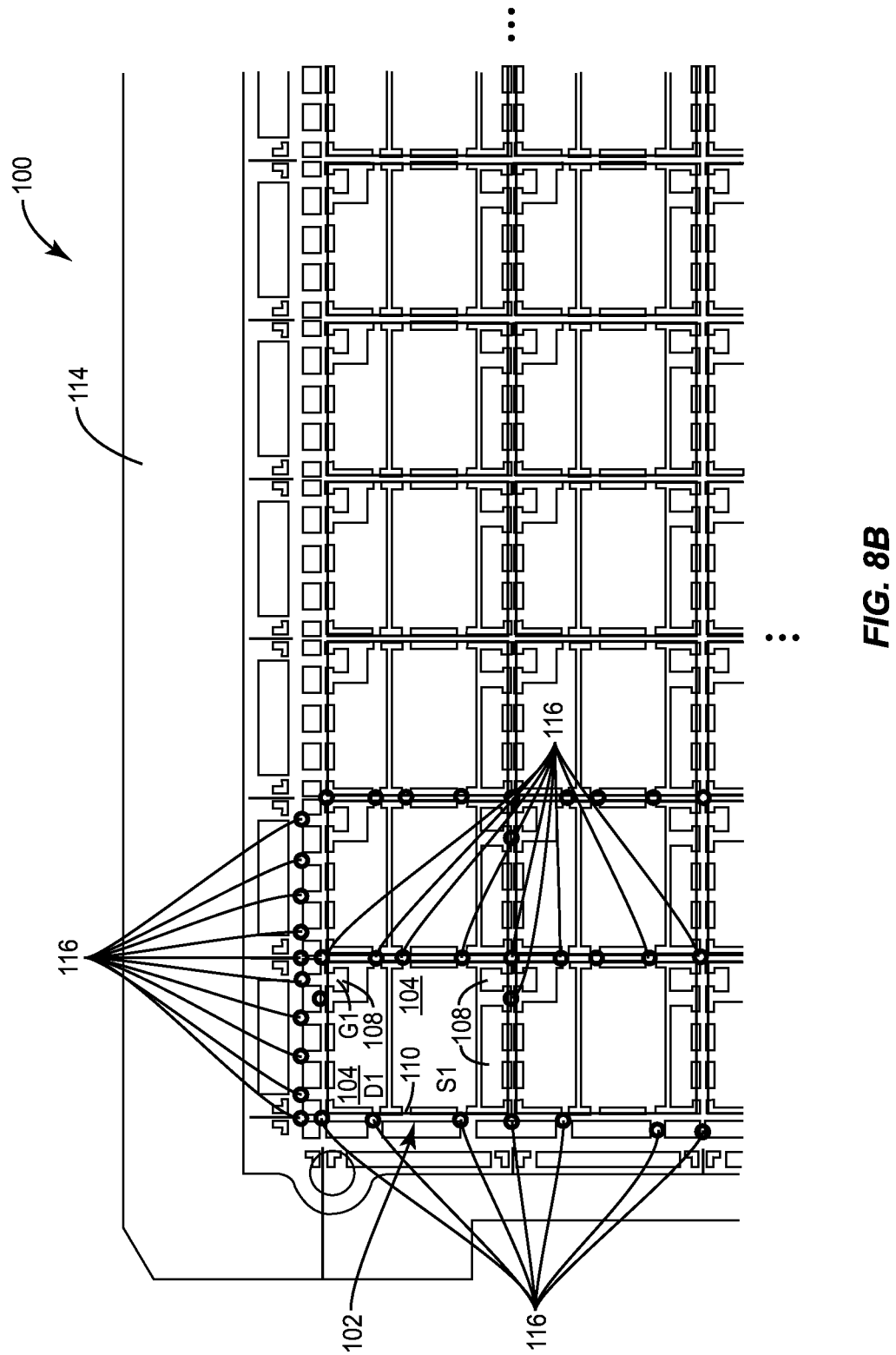

FIG. 8B shows the leadframe strip 100 during testing of the upper transistor die (out of view) of the upper-left unit leadframe 102. The source (S1), gate (G1) and drain (D1) terminals of the upper transistor die are accessed during testing of the upper die. The regions of the unit leadframe 102 probed during testing of the upper transistor die are correspondingly labeled S1, G1 and D1 in FIG. 8B. The gate terminal G1 extends beyond (outside) the final lead outline 110 of the unit leadframe 102 so that additional contact area is available for probing the gate terminal G1.

Figure 8C:
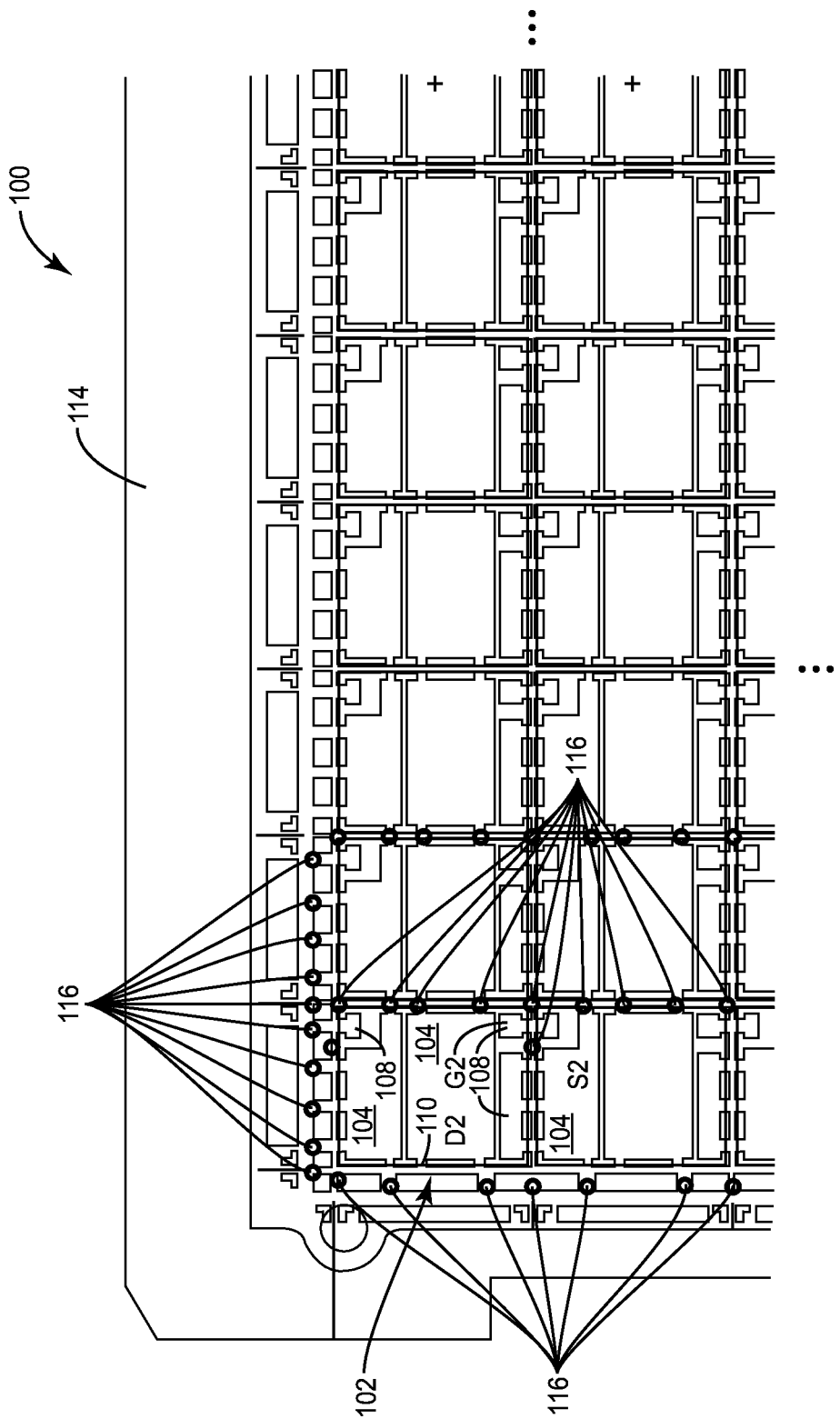

FIG. 8C shows the leadframe strip 100 during testing of the lower transistor die of the upper-left unit leadframe 102. The source (S2), gate (G2) and drain (D2) terminals of the lower transistor die are accessed during testing of the lower die. The regions of the unit leadframe 102 probed during testing of the lower transistor die are correspondingly labeled S2, G2 and D2 in FIG. 8C. The gate lead 108 for the lower transistor die extends beyond (outside) the final lead outline 110 of the unit leadframe 102 so that is available for probing the gate terminal G2 of the lower die. Also, the source leads 108 for the lower transistor die of the upper-left unit leadframe 102 remain integrally connected to the upper die paddle 104 of the adjacent unit leadframe 102 after the electrical isolation process. As such, the source terminal of the lower transistor die of the upper-left unit leadframe 102 can be accessed during testing by probing the die paddle 104 of the adjacent unit leadframe 102 as indicated by the label S2 in FIG. 8C instead of contacting the actual source leads 108 assigned to the lower transistor die of the upper-left unit leadframe 102.

Figure 8D:
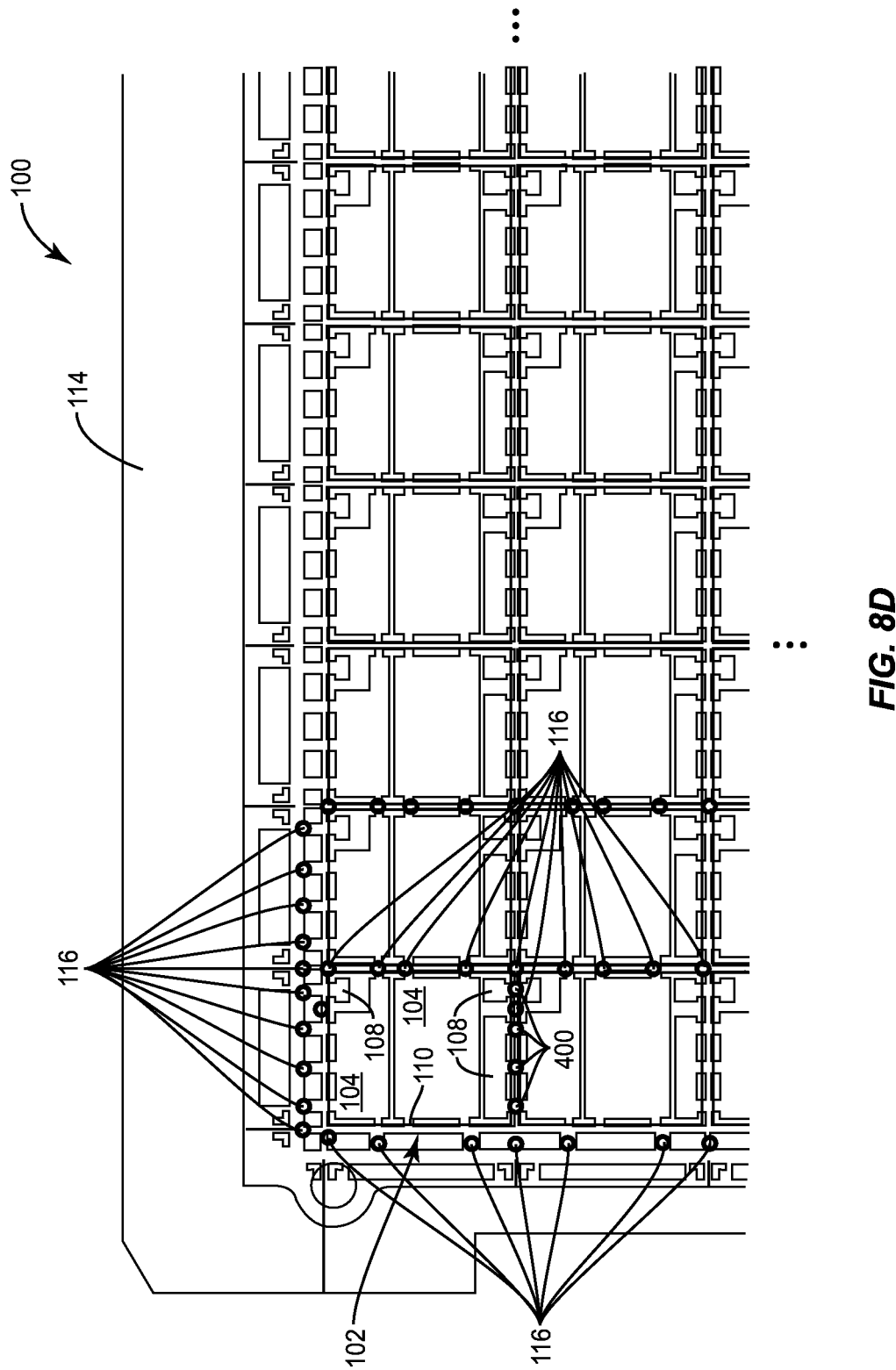

FIG. 8D shows the leadframe strip 100 during separation (singulation) of the upper-left unit leadframe 102 from the adjacent unit leadframe 102 in the same row. The regions of the leadframe strip labeled 400 in FIG. 8D are removed e.g. by laser drilling, water jet cutting or etching to singulate the two unit leadframes 102. The same electrical isolation, testing and singulation processes can be performed in series or parallel for the remainder of the unit leadframe strip 100.

Figure 9:
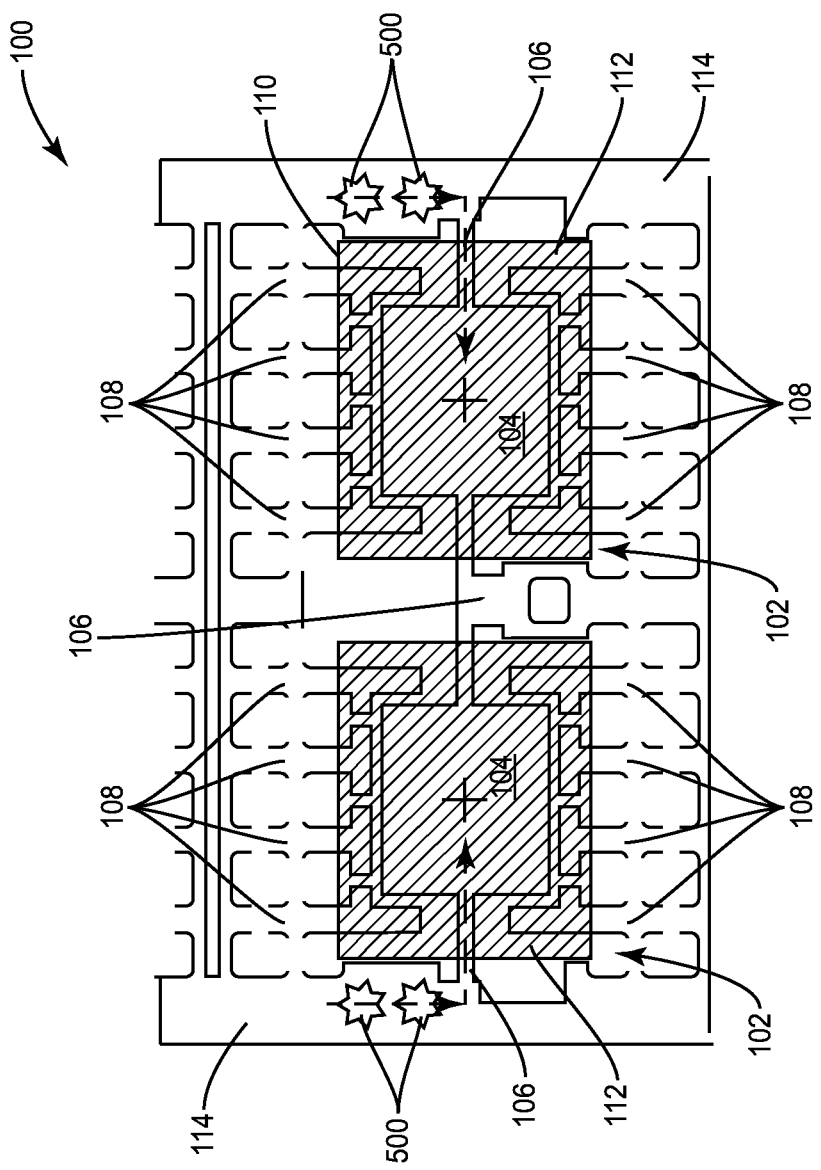
FIG. 9 illustrates a partial bottom plan view of an embodiment of a leadframe strip having leads that are electrically isolated from the periphery of the leadframe strip prior to die testing.

FIG. 9 illustrates an embodiment of electrically isolating the leads 108 of a leadframe strip 100 from the periphery 114 of the leadframe strip 100 prior to die testing. According to this embodiment, the die paddles 104 of the unit leadframes 102 remain integrally connected to the periphery 114 of the leadframe strip 100 during die testing. The periphery 114 of the leadframe strip 100 can be contacted at different probe points 500 to enable electrical testing of the dies (out of view) attached to the die paddles 104 of the unit leadframes 102. The corresponding electrical test pathways through the tie bars 106 are illustrated as dashed lines in FIG. 9. The die paddles 104 are severed after die testing, to singulate the unit leadframes 102 into individual packages as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of testing a leadframe strip that comprises a plurality of unit leadframes connected to a periphery of the leadframe strip, each unit leadframe having a die paddle, a plurality of leads and a semiconductor die attached to the die paddle, the method comprising:
    electrically isolating at least the leads from the periphery of the leadframe strip such that at least some of the leads extend uninterrupted beyond a final lead outline of the unit leadframes after electrical isolation from the periphery of the leadframe strip;
    testing the semiconductor dies, which includes probing the die paddles and the leads that extend uninterrupted beyond the final lead outline of the unit leadframes after electrical isolation from the periphery of the leadframe strip; and
    severing the unit leadframes from the leadframe strip along the final lead outline of the unit leadframes after testing the semiconductor dies.

2. The method of claim 1, wherein the unit leadframes including the semiconductor dies are covered by a molding compound at a first side of the leadframe strip, and wherein electrically isolating at least the leads from the periphery of the leadframe strip comprises:
    removing parts of the leadframe strip from a second side of the leadframe strip opposite the first side.

3. The method of claim 2, wherein the parts of the leadframe strip are removed by laser drilling, water jet cutting or etching at the second side of the leadframe strip.

4. The method of claim 1, wherein at least some of the leads of a first one of the unit leadframes remain integrally connected to the die paddle of an adjacent second one of the unit leadframes after electrical isolation from the periphery of the leadframe strip, and wherein testing the semiconductor dies comprises:
  probing the die paddle of the first unit leadframe;
  probing the die paddle of the second unit leadframe instead of the leads of the first unit leadframe that remain integrally connected to the die paddle of the second unit leadframe; and
  testing the semiconductor die attached to the die paddle of the first unit leadframe via the probe connections to the die paddles of the first and second unit leadframes.

5. The method of claim 4, wherein the semiconductor die of the first unit leadframe is a transistor die having an output terminal attached to the die paddle of the first unit leadframe, a gate terminal electrically connected to a first subset of the leads of the first unit leadframe and a reference terminal electrically connected to a second subset of the leads of the first unit leadframe, the method further comprising:
  severing the first subset of leads from the die paddle of the second unit leadframe prior to testing the transistor die; and
  during testing of the transistor die, probing each lead in the first subset to access the gate terminal of the transistor die and probing the die paddle of the second unit leadframe instead of the leads in the second subset to access the reference terminal of the transistor die.

6. The method of claim 5, wherein the first subset of leads extends uninterrupted beyond the final lead outline of the first unit leadframe after being severed from the die paddle of the second unit leadframe such that during testing of the transistor die, each lead in the first subset is probed outside the final lead outline of the first unit leadframe.

7. The method of claim 4, wherein at least some the leads of the second unit leadframe remain integrally connected to the die paddle of a third one of the unit leadframes after electrical isolation from the periphery of the leadframe strip, and wherein testing the semiconductor dies comprises:
  probing the die paddle of the second unit leadframe;
  probing the die paddle of the third unit leadframe instead of the leads of the second unit leadframe that remain integrally connected to the die paddle of the third unit leadframe; and
  testing the semiconductor die attached to the die paddle of the second unit leadframe via the probe connections to the die paddles of the second and third unit leadframes.

8. The method of claim 1, wherein testing the semiconductor dies comprises probing the part of the leads that extend uninterrupted beyond the final lead outline of the unit leadframes after electrical isolation from the periphery of the leadframe strip instead of the part of the leads within the final lead outline of the unit leadframes.

9. The method of claim 1, wherein the part of the leads that extend uninterrupted beyond the final lead outline of the unit leadframes after electrical isolation from the periphery of the leadframe strip have a probe contact area that is at least three times greater than the part of the leads within the final lead outline of the unit leadframes.

10. The method of claim 1, wherein a part of the leads that extends uninterrupted beyond the final lead outline of the unit leadframes after electrical isolation from the periphery of the leadframe strip has a probe contact area that is at least ten times greater than a part of the leads within the final lead outline of the unit leadframes.

11. The method of claim 1, wherein at least some of the leads of each unit leadframe in a first row of the leadframe strip are integrally connected to the die paddle of the adjacent unit leadframe in a second row of the leadframe strip next to the first row, and wherein electrically isolating at least the leads from the periphery of the leadframe strip comprises:
  severing the leads of each unit leadframe in the first row of the leadframe strip from the die paddle of the adjacent unit leadframe in the second row of the leadframe strip in a region outside the final lead outline of the unit leadframes in the first row of the leadframe strip.

12. The method of claim 11, wherein the first row is adjacent one side of the periphery of the leadframe strip, wherein the die paddle of each unit leadframe in the first row of the leadframe strip is integrally connected to the periphery of the leadframe strip, and wherein electrically isolating at least the leads from the periphery of the leadframe strip comprises:
  severing the die paddle of each unit leadframe in the first row of the leadframe strip from the periphery of the leadframe strip.

13. The method of claim 1, wherein a first group of the leads of each unit leadframe in a first row of the leadframe strip are integrally connected in an interdigitated arrangement to a second group of the leads of the unit leadframes in a second row of the leadframe strip next to the first row, and wherein electrically isolating at least the leads from the periphery of the leadframe strip comprises:
  severing the connection between the interdigitated leads of the unit leadframes in the first and second rows of the leadframe strip such that the leads in the first and second groups extend uninterrupted beyond the final lead outline of the unit leadframes in the first and second rows after the severing.

14. The method of claim 1, wherein the semiconductor dies are transistor dies each having an output terminal, a gate terminal and a reference terminal, and wherein the reference terminals are electrically connected to at least some of the leads that extend uninterrupted beyond the final lead outline of the unit leadframe after electrical isolation from the periphery of the leadframe strip.

15. The method of claim 14, wherein the gate terminals are electrically connected to other ones of the leads that extend uninterrupted beyond the final lead outline of the unit leadframe after electrical isolation from the periphery of the leadframe strip.

16. The method of claim 1, wherein each unit leadframe has a plurality of die paddles and a semiconductor die attached to each die paddle, and wherein at least the leads of each unit leadframe are electrically isolated from the periphery of the leadframe strip such that at least some of the leads of each unit leadframe extend uninterrupted beyond the final lead outline of that unit leadframe after electrical isolation from the periphery of the leadframe strip.

17. The method of claim 1, further comprising:
  electrically isolating the die paddles from the periphery of the leadframe strip prior to testing the respective semiconductor dies.

* * * * *